(12) United States Patent
Olgaard

(10) Patent No.: US 8,170,490 B2
(45) Date of Patent: May 1, 2012

(54) METHOD AND APPARATUS FOR TESTING MULTIPLE DATA SIGNAL TRANSCEIVERS SUBSTANTIALLY SIMULTANEOUSLY WITH COMMON TRANSCEIVER TESTER

(75) Inventor: Christian Volf Olgaard, Saratoga, CA (US)

(73) Assignee: Litepoint Corporation, Sunnyvale, CA (US)

( * ) Notice: Subject to any disclaimer, the term of this patent is extended or adjusted under 35 U.S.C. 154(b) by 349 days.

(21) Appl. No.: 12/420,294

(22) Filed: Apr. 8, 2009

(65) Prior Publication Data

US 2010/0261431 A1 Oct. 14, 2010

(51) Int. Cl.
*H04B 17/00* (2006.01)
*H04J 3/06* (2006.01)

(52) U.S. Cl. .................................. 455/67.11; 370/252

(58) Field of Classification Search ............... 455/67.11, 455/67.14, 115.2; 714/707, 744; 370/241, 370/252
See application file for complete search history.

(56) References Cited

U.S. PATENT DOCUMENTS

| | | | |
|---|---|---|---|
| 4,833,676 A | 5/1989 | Koo | |
| 4,897,842 A | 1/1990 | Herz | |
| 5,138,608 A | 8/1992 | Kucera et al. | |
| 5,910,977 A | 6/1999 | Torregrossa | |
| 6,753,693 B2 | 6/2004 | Seo et al. | |
| 6,870,392 B2 | 3/2005 | Kilian et al. | |
| 6,986,086 B2 | 1/2006 | Scholten | |
| 7,057,518 B2 | 6/2006 | Schmidt | |
| 7,275,197 B2 * | 9/2007 | Inaba et al. | 714/740 |
| 7,463,140 B2 | 12/2008 | Schmidt | |
| 7,564,893 B2 | 7/2009 | O'Neill | |
| 7,890,822 B2 | 2/2011 | Behziz et al. | |
| 2001/0043648 A1 | 11/2001 | Ducaroir et al. | |
| 2002/0071147 A1 | 6/2002 | Lin et al. | |
| 2004/0121733 A1 | 6/2004 | Peng | |

OTHER PUBLICATIONS

International Search Report corresponding to International Application No. PCT/US2010/028987 dated Oct. 26, 2010, 3 pages.
Written Opinion corresponding to International Application No. PCT/US2010/028987 dated Oct. 26, 2010, 3 pages.
International Preliminary Report on Patentability to International Application No. PCT/US2010/028987 dated Oct. 11, 2011, 1 page.
Written Opinion of the International Searching Authority to International Application No. PCT/US2010/028987 dated Oct. 26, 2010, 3 pages.

* cited by examiner

*Primary Examiner* — Dean O Takaoka

(57) ABSTRACT

A method and apparatus for testing multiple data signal transceivers substantially simultaneously with a common transceiver tester by analyzing previously captured data signal transmissions from some of the data signal transceivers while continuing to capture further data signal transmissions from additional ones of the data signal transceivers.

26 Claims, 5 Drawing Sheets

METHOD AND APPARATUS FOR TESTING MULTIPLE DATA SIGNAL TRANSCEIVERS SUBSTANTIALLY SIMULTANEOUSLY WITH COMMON TRANSCEIVER TESTER

BACKGROUND OF THE INVENTION

1. Field of the Invention

The present invention relates to methods and systems for testing data signal transceivers, and in particular, to methods and systems for testing multiple data signal transceivers with minimal test equipment.

2. Related Art

As electronic devices and systems have become more complex, testing their performance for compliance with specifications has become more complex and costly. Indeed, while such devices and systems become increasingly integrated and manufacturing costs decrease, costs for testing often increase, particularly when testing such products in high volumes. While the time needed to properly test such products is important, test equipment costs (including acquisition, operation, training and maintenance) must also be considered since such costs are often significant. Relevant to this consideration is test equipment utilization, i.e., more complete use of test equipment in terms of both capabilities and time maximize cost efficiency.

Typically, measurements performed as part of an overall test sequence can often be separated with each measurement then optimized for performance in the least amount of time. For example, a measurement of the transmitter for a radio frequency (RF) transceiver will typically include a command to control the device under test (DUT), followed by capturing and digitizing the resulting transmitted signal, following which, in turn, the digitized signal is analyzed. Often, the digitized signal is moved into a different area of memory so as to free up that portion of memory for use in storing newly captured and digitized data, thereby enabling the capture and digitizing of a subsequent signal while the previous signal is analyzed. Such movement of the captured and digitized data can occur after the capture and digitizing is completed, or it can occur while capturing and digitizing is going on by use of more complex memory structures, such as dual port or dual bank memory.

In the case of simple data verification, it is relatively simple to begin capturing and digitizing new signal data while the previous signal data is being analyzed, although the necessary control software can be more complex due to the need for new commands to capture new signal data before completion of the previous data processing. In the case of data calibration, it can be more difficult as program progress and decisions often depend upon the previous results to determine the next step.

In high volume manufacturing tests, multiple manufacturing lines often run in parallel with each manufacturing station to accommodate more than one DUT, thereby minimizing required testing area (e.g., floor space). For example, this can be done by stacking test equipment such that two testers are used to test four DUTs as part of one test setup. If handling time is comparable to testing time, "ping-pong" testing can be performed by which one DUT is loaded while the other DUT is tested, thereby reducing the amount of test equipment by half and improving test equipment utilization. However, with test times generally being longer compared to the handling time, benefits of such "ping-pong" testing tend to be minimal.

Another cost reduction technique has been to integrate multiple test instruments as a single unit. This can often reduce the cost of the test equipment, at least somewhat, particularly as long as various portions of the individual instruments can be operated independently of each other, thereby increasing test instrument utilization and decreasing the space required for such test equipment.

SUMMARY OF THE INVENTION

In accordance with the presently claimed invention, a method and apparatus are provided for testing multiple data signal transceivers substantially simultaneously with a common transceiver tester by analyzing previously captured data signal transmissions from some of the data signal transceivers while continuing to capture further data signal transmissions from additional ones of the data signal transceivers.

In accordance with one embodiment of the presently claimed invention, a method for testing multiple data signal transceivers substantially simultaneously with a common transceiver tester includes:

initiating, with a first portion of a transceiver tester, a plurality of data signal transmissions by a plurality of data signal transceivers;

capturing, during each one of a first plurality of mutually exclusive time intervals with a second portion of the transceiver tester, a respective portion of the plurality of data signal transmissions from each one of one or more respective ones of the plurality of data signal transceivers to provide one or more corresponding portions of a plurality of captured data; and analyzing, during each one of a second plurality of time intervals with the second portion of the transceiver tester, one or more respective portions of the plurality of captured data, wherein each one of the second plurality of time intervals follows a respective one of the first plurality of mutually exclusive time intervals.

In accordance with another embodiment of the presently claimed invention, a transceiver tester for testing multiple data signal transceivers substantially simultaneously includes:

initiating means for initiating a plurality of data signal transmissions by a plurality of data signal transceivers;

capturing means for capturing, during each one of a first plurality of mutually exclusive time intervals with a second portion of the transceiver tester, a respective portion of the plurality of data signal transmissions from each one of one or more respective ones of the plurality of data signal transceivers to provide one or more corresponding portions of a plurality of captured data; and analyzing means for analyzing, during each one of a second plurality of time intervals with the second portion of the transceiver tester, one or more respective portions of the plurality of captured data, wherein each one of the second plurality of time intervals follows a respective one of the first plurality of mutually exclusive time intervals.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
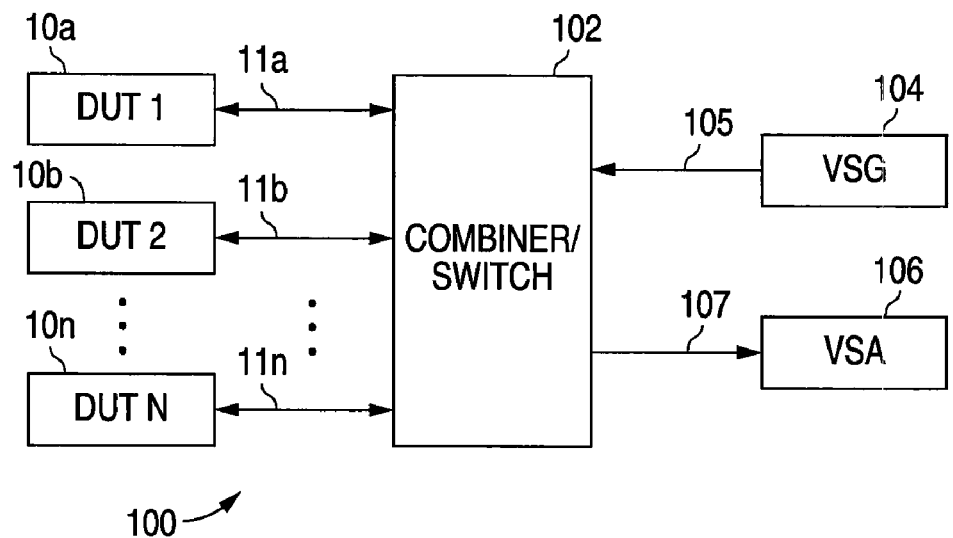
FIG. 1 is a function block diagram of a transceiver tester for testing in accordance with one embodiment of the presently claimed invention.

Referring to FIG. 1, testing multiple data signal transceivers substantially simultaneously with a common transceiver tester in accordance with one embodiment of the presently claimed invention can be achieved using a form of integrated tester 100 that includes a combiner/switch 102 (discussed in more detail below), a vector signal generator (VSG) 104 and a vector signal analyzer (VSA) 106 for coupling to and testing multiple DUTs 10a, 10b, . . . 10n. As discussed in more detail below, signals 11a, 11b, . . . 11n to and from the DUTs 10a, 10b, . . . 10n and conveyed via the combiner/switch 102 are signals 105 from the VSG 104 and signals 107 to the VSA 106. For example, control signals 105 provided by the VSG 104 can be provided to selected ones of the DUTs 10a, 10b, . . . 10n, following which selected data signal transmissions from the DUTs are provided as the signal 107 to the VSA 106.

Figure 2A:
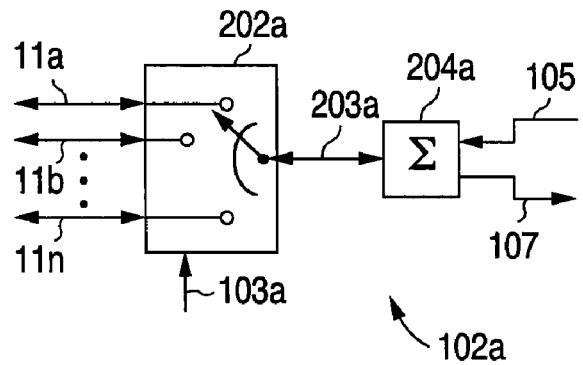
FIGS. 2A and 2B are functional block diagrams of exemplary embodiments of the combiner/switch of FIG. 1.

Referring to FIG. 2A, one example embodiment 102a of the combiner/switch 102 can include a single pole, multiple throw switch 202a and a signal combiner/splitter 204a, interconnected substantially as shown. As discussed above, control signals 105 from the VSG 104 are conveyed via the signal combiner/splitter 204a as signals 203a to the pole of the switch 202a. In accordance with control data (e.g., contained within the VSG signal 203a or within one or more dedicated control signals 103a), the switch 202a conveys the control signal to a selected one of the DUTs 10a, 10b, . . . 10n. The selected DUT then performs its data signal transmission which is received via the interconnected throw and pole of the switch 202a as a received signal 203a, which, in turn, is conveyed via the signal combiner/splitter 204a as the signal 107 to the VSA 106. Following capture of the data signal transmission by the VSA, the switch 202a can be controlled to select a new DUT by connecting its pole to a different throw. As discussed in more detail below, while this newly selected DUT initiates a new data signal transmission for capture by the VSA, analysis within the VSA 106 can proceed for the most recently captured data.

Figure 2B:
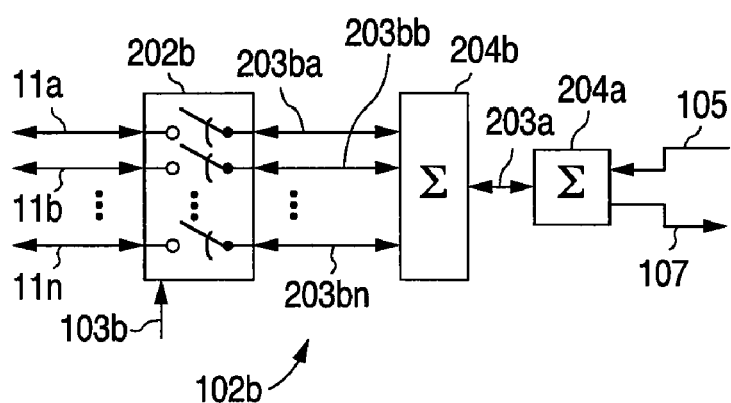

Referring to FIG. 2B, an alternative embodiment 102b of the combiner/switch 102 can use multiple single pole, single throw switches 202b with a multi-port signal combiner/splitter 204b in place of the single pole, multiple throw switch 202a. As before, in accordance with control data (e.g., received via the VSG signal 105/203a or one or more other control signals 103b), individual ones of the switches 202b can be closed to select a DUT 10a, 10b, . . . 10n for initiating and capturing a data signal transmission.

Figure 3:
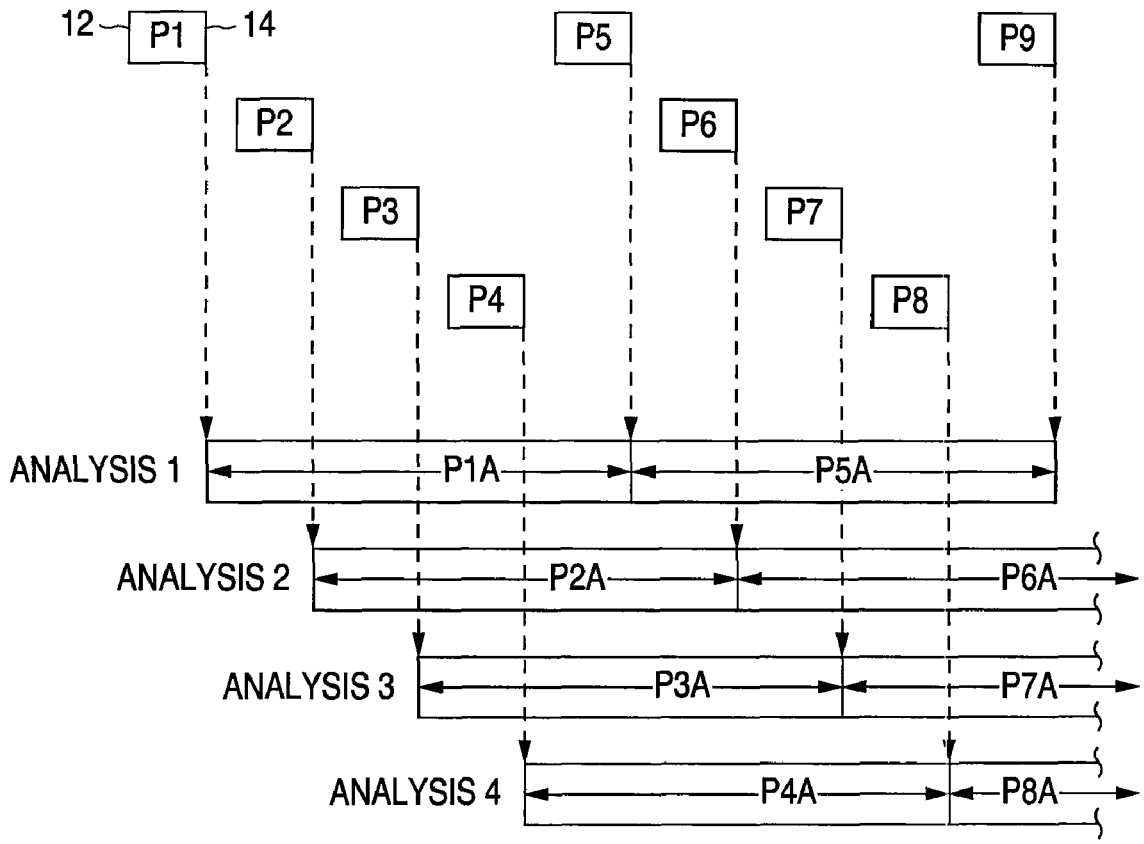
FIG. 3 is a diagram depicting capturing and analysis of signal data in accordance with one embodiment of the presently claimed invention.

Referring to FIG. 3, in accordance with one example embodiment of the presently claimed invention, the combiner/switch 102 (FIG. 1) will accommodate four DUTs 10a, 10b, 10c, 10d while the VSA 106 provides a data analysis engine capable of performing four data analyses in parallel, e.g., using a four-core microprocessor. This will allow the results of four consecutive data captures to be analyzed in parallel without the necessity of breaking each analysis down into compatible parallel processes. In other words, each core can independently analyze its own set of data irrespective of analyses being performed by the other cores.

For the purposes of this example, it is assumed there are four DUTs 10a, 10b, 10c, 10d each of which transmits a data signal, e.g., data packet P1, P2, . . . (each of which has a beginning 12, e.g., a leading edge, and an ending 14, e.g., a trailing edge). Following transmission of each data signal, P1, P2, . . . , selected portions or all of each such set of data is captured for a corresponding analysis P1A, P2A, . . . in a respective one of the four microprocessor cores. As discussed above, each respective set of data P1, P2, . . . is received from a corresponding one of the DUTs 10a, 10b, 10c, 10d as selected by the combiner/switch 102 (FIG. 1). In accordance with well known techniques, the timing of the initiating and capturing of the data signal transmissions can be controlled such that, in the case of the first DUT 10a and microprocessor core (Analysis 1), following capture of the first set of data P1 and completion of its analysis P1A, the next set of data P5 transmitted by the same DUT 10a is captured and analyzed P5A by the same microprocessor core (Analysis 1). Similarly, successive sets of data P2, P6 from the second DUT 10b are captured and analyzed P2A, P6A in sequence by the same microprocessor core (Analysis 2), and so on. As discussed in more detail below, this parallel capturing and analysis of data will require separate memory for storage of the captured data and storage of that data currently undergoing analysis.

Controlling this operation so that the capturing and analysis operations are operating in parallel can be achieved in a number of ways. In accordance with one technique, multiple DUTs 10 (FIG. 1) transmit in parallel, i.e., simultaneously, during which selective sequential capturing of date is performed (e.g., similar to that as disclosed in U.S. Pat. No. 7,484,146, the disclosure of which is incorporated herein by reference). Typically, all DUTs 10 being operated in parallel in this manner would operate in accordance with the same test, i.e., transmit similar or identical data signals. This would limit the complexity of the signal transmission sequences that could be used, since operating the sequences in parallel and switching between the different DUTs 10 would make it difficult to identify where in a sequence a new DUT 10 has been selected for data signal capture and analysis. In accordance with another technique, a preloaded test flow with synchronization steps is used (e.g., similar to that as disclosed in U.S. Patent Publication 2008/0285467, the disclosure of which is incorporated herein by reference). The use of synchronization between sets of test data enable sequence based testing to be used, since the test instrument can selectively start a test in each DUT 10 by selecting which DUT 10 to which a synchronization start command is to be provided.

Figure 4:
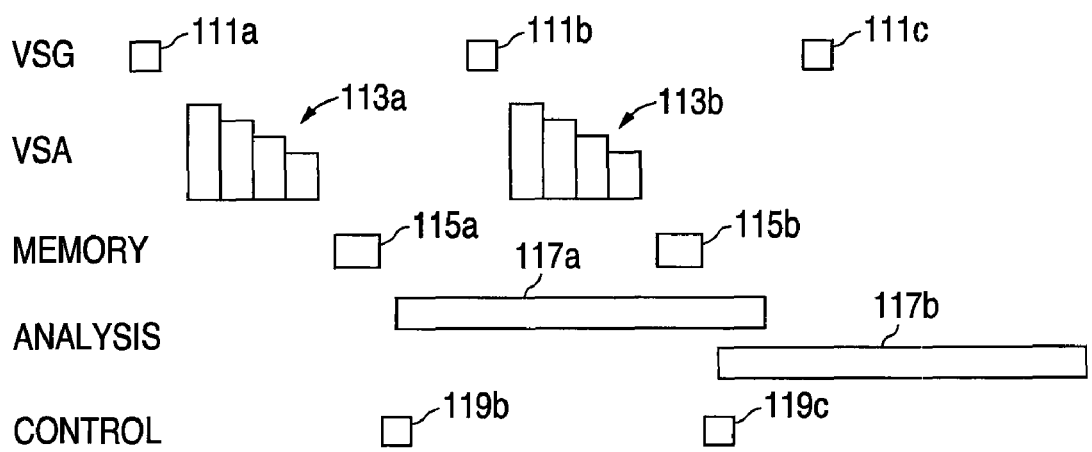
FIG. 4 is a diagram depicting capturing and analysis of signal data in accordance with another embodiment of the presently claimed invention.

Referring to FIG. 4, such a preloaded test flow technique can be better understood. When beginning, all DUTs 10 are coupled to the combiner/switch 102 (FIG. 1) and await a command to be received from the tester 100 to initiate data signal transmissions. The test instrument 100 selects one of the DUTs 10 by appropriate control of the combiner/switch 102 (as discussed above), and the VSG 104 provides the necessary command 111a to initiate data signal transmission by the selected DUT 10. The selected DUT 10 begins to execute the predetermined test command by transmitting the corresponding data signal 113a (e.g., multiple signal transmission power levels as depicted here). This transmitted data signal 113a is captured by the VSA 106 and stored 115a in memory, following which analysis 117a of such captured data 115a can begin. Meanwhile, in parallel with this analysis 117a, the test instrument 100 is reconfigured 119b such that the VSG 104 and the VSA 106 are now connected to a different DUT 10 via the combiner/switch 102. Once the test instrument 100 is ready (e.g., operating frequency and gain settings are updated as needed), the VSG 104 transmits 111b a command to the selected DUT 10 to initiate testing. In response to this, the selected DUT 10 transmits the predetermined test signal 113b, which is captured and stored 115b in memory for analysis 117b. This process can be repeated as desired in accordance with the general timing as shown here by reconfiguring 119c the test instrument 100 again such that the VSG 104 and the VSA 106 are now connected to a different DUT 10 via the combiner/switch 102.

As noted, following the capturing and storage 115a, 115b of the received data, the reconfiguration 119b, 119c of the combiner/switch 102, VSG 104 and VSA 106 (e.g., via appropriate control signals for the hardware) prepare the test instrument 100 for selecting and testing another DUT 10. Such control can precede or be coincident with the beginning of the data analyses 117a, 117b. Alternatively, setup time for the test instrument 100 can be reduced by implementing out-of-order testing. For example, if four DUTs 10 are to be tested in parallel, with two to be tested at frequency F1 and two to be tested at frequency F2, the command queue in the VSG 104 would command the instrument 100 to test at frequency F1 (e.g., using DUT 1), followed by frequency F2 (e.g., using DUT 2), followed by frequency F1 (e.g., using DUT 3), followed by frequency F2 (e.g., using DUT 4). Further alternatively, the testing order of the DUTs 10 can be arranged to only require one frequency change during the testing of the four DUTs 10.

More complex testing can also be performed by using alternative commands to initiate testing of the selected DUTs. For example, a command can be issued to repeat or retry a previously executed test sequence. Also, commands from the VSG 105 can be sent to the selected DUT to initiate a new test. (This would require software within the DUT to enable reception, analysis and execution of the new test command.)

Figure 5:
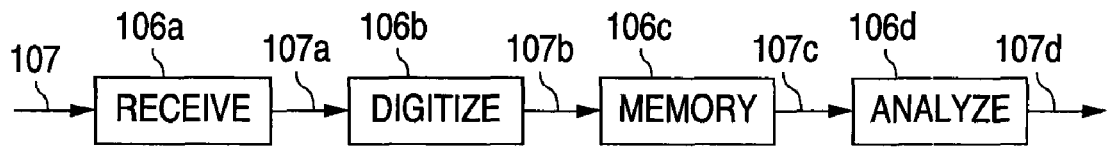
FIG. 5 is a functional block diagram of an exemplary embodiment of the vector signal analyzer (VSA) of FIG. 1.

Referring to FIG. 5, the VSA 106 includes at least four stages: a receive stage 106a, a digitizing stage 106b, a memory stage 106c and an analysis stage 106d, interconnected substantially as shown. The incoming signal 107 is processed by the receiver 106a (e.g., performing frequency down conversion and demodulation) to produce the signal 107a containing analog data which is digitized by the digitizing stage 106b. The resulting digital data 107b is stored in memory 106c (discussed in more detail below). Data 107c retrieved from memory is analyzed by the analysis stage 106d to produce data 107d for presentation to or other use by the user.

Figure 6A:
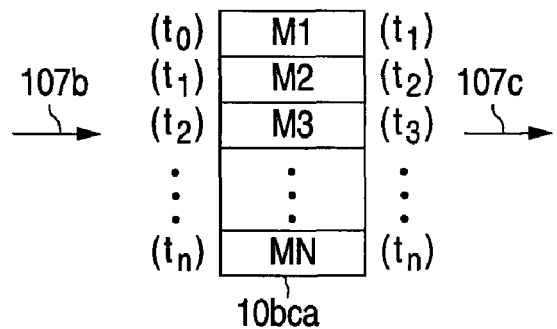
FIGS. 6A-6C depict alternative memory configurations for use in the VSA of FIG. 1.

Referring to FIG. 6A, one example embodiment 106ca of the memory stage 106c includes a dual port memory in which the incoming data 107b is stored in successive memory locations, e.g., during time intervals $t_0, t_1, \ldots t_{n-1}$. Data 107cc an be retrieved from each memory location at a subsequent time interval, e.g., during time intervals $t_1, t_2, \ldots t_n$, respectively. Accordingly, each memory location is accessed only once, i.e., for writing or reading data, during each time interval.

Figure 6B:
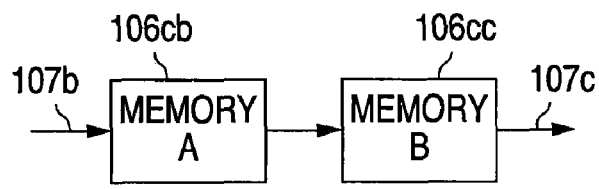

Referring to FIG. 6B, in an alternative embodiment, the digitized data 107b can be stored in a first memory 106cb following which the previously stored data is transferred to a second memory 106cc for access by the analysis stage 106d.

Figure 6C:
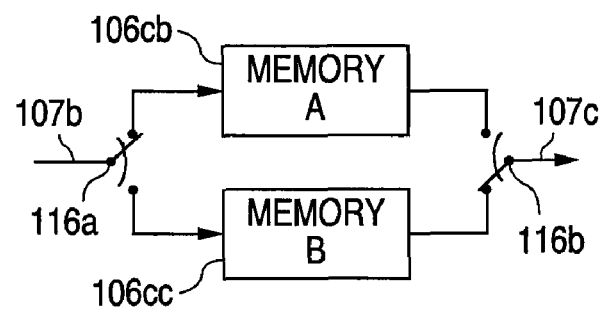

Referring to FIG. 6C, in another alternative embodiment, input 116a and output 116b switches can be used to alternate access to the two memory stages 106cb, 106cc. For example, the digitized data 107b can be stored in the first memory stage 106cb while data 107c is read from the second memory stage 106cc. During testing of the next DUT, these switches 116a, 116b can be controlled to cause the incoming digitized data 107b to be written to the second memory stage 106cc while data 107c is read from the first memory stage 106cb.

During testing of multiple DUTs 10, the sensitivity of each DUT may cause more than the intended DUT to respond to commands from the VSG 104, thereby causing multiple DUTs to be transmitting simultaneously and thereby affect synchronization of the test sequence. This can be avoided by appropriately high isolation between the signal ports of the combiner/switch 102, or by causing the data signal transmissions to occur at sufficiently low power levels such that nominal or minimum isolation between the signal ports ensures that other DUTs will not be affected by the currently transmitted signal. Further alternatively, different addressing can be used for different DUTs. For example, in the case of Wi-Fi devices, different media access control (MAC) addresses can be assigned for each DUT, thereby ensuring that each DUT filters out, or disregards, signals not intended for it.

In addition to the capability of testing multiple DUTs with a common transceiver tester, the hardware configuration of FIG. 1 also allows parallel testing of the DUT receivers, since the VSG 104 can transmit the same signal to multiple DUTs 10 via the combiner/switch 102, e.g., by simultaneously closing all switches as shown in FIG. 2B. This will allow parallel testing of the DUT receivers with MAC filtering disabled, or by changing the MAC address during receiver testing to a predetermined address. Alternatively, for Wi-Fi devices, the broadcast address can be used, since each device should be able to receive this signal independent of its respective MAC address.

Figure 7:
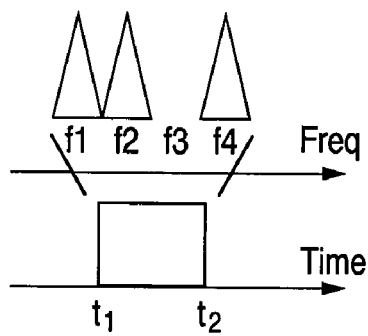
FIG. 7 depicts a vector signal generator (VSG) signal transmission containing multiple command signals at different frequencies for testing in accordance with another embodiment of the presently claimed invention.

Referring to FIG. 7, for example, the VSG 104 transmits its signal 105 containing multiple command signals with data packet contents at three out of four frequencies f1, f2, f4 (for purposes of this example, no signal is transmitted at frequency f3). This signal 105, containing all three command signals at the three frequencies f1, f2, f4 is divided in magnitude, (i.e., power) by the combiner/switch 102 and distributed as the signals 11a, 11b, 11c, 11d to the four DUTs 10a, 10b, 10c, 10d during time interval t1-t2.

Figure 8:
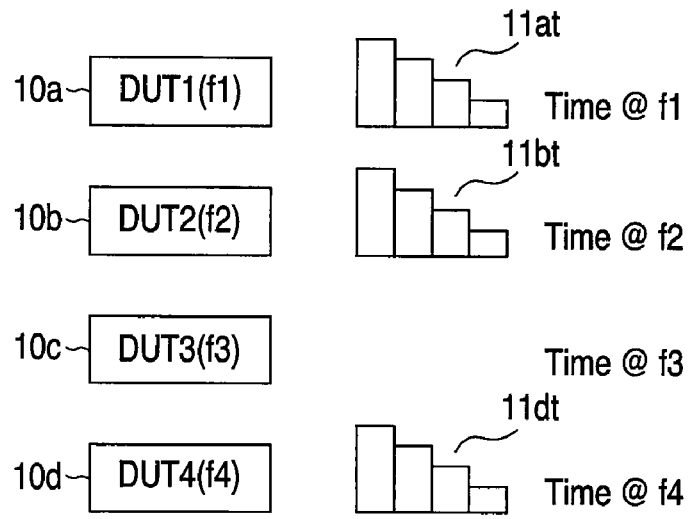
FIG. 8 depicts multiple DUT signal transmissions in response to the VSG command signals of FIG. 7.

Referring to FIG. 8, in response to their respective command signals at frequencies f1, f2 and f4, DUTs 10a, 10b and 10d transmit data signals 11at, 11bt and 11dt at different respective frequencies, which can be the same three frequencies f1, f2, f4. (Generally, the receiver stage within the VSA will be sufficiently linear to preclude undesirable mixing of the incoming signals which could interfere with or degrade signal measurements. However, it will be readily understood that if receiver linearity is less than otherwise desired then the signal frequencies can be spaced sufficiently far apart to minimize any mixing within the receiver.)

Figure 9:
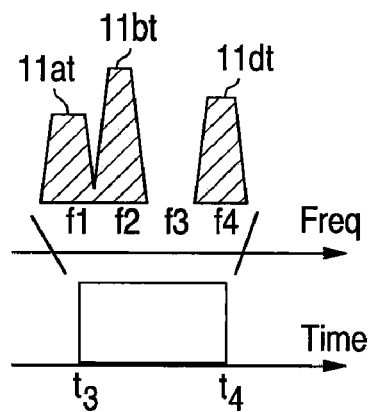
FIG. 9 depicts the multiple DUT signal transmissions of FIG. 8 combined for reception by the VSA.

Referring to FIG. 9, these signals 11at, 11bt, 11dt, which are transmitted during time interval t3-t4, are combined by the combiner/switch 102 to provide the receive signal 107 for the VSA 106. As discussed above, the VSA 106 will receive, digitize, store and analyze these signals 11at, 11bt, 11dt. However, since these signals are all received simultaneously, although at different frequencies, they must first be separated (e.g., demultiplexed) so that each data signal can be individually analyzed.

Figure 10:
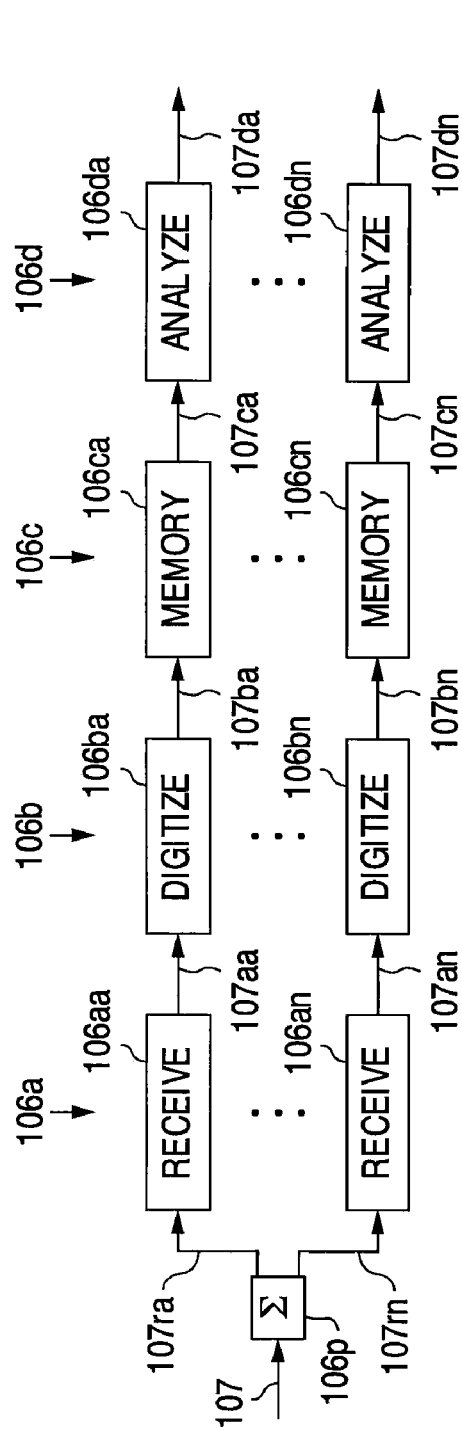
FIGS. 10, 11A and 11B are functional block diagrams of alternative embodiments of the VSA of FIG. 1.

Referring to FIG. 10, in accordance with one embodiment of the presently claimed invention, this signal separation is done in the frequency domain, e.g., the VSA 106 performs frequency demultiplexing of the received signal 107. The received signal 107 is first divided in magnitude (i.e., power) with a signal divider 106p to provide a corresponding replica signal 107ra, . . . 107rn for each receive channel. Each receive channel includes a receive stage 106a, a digitizing stage 106b, a memory stage 106c and an analyzing stage 106d, as discussed above (FIG. 5). However, in accordance with this embodiment, the receive stage 106a includes frequency selectivity, e.g., filtering or selective frequency down conversion, for selecting the desired signal 11at, 11bt, 11dt at the frequency of interest. Following such selection of the desired signal 11at, 11bt, 11dt, its processing proceeds as discussed above (FIG. 5).

Figure 11A:
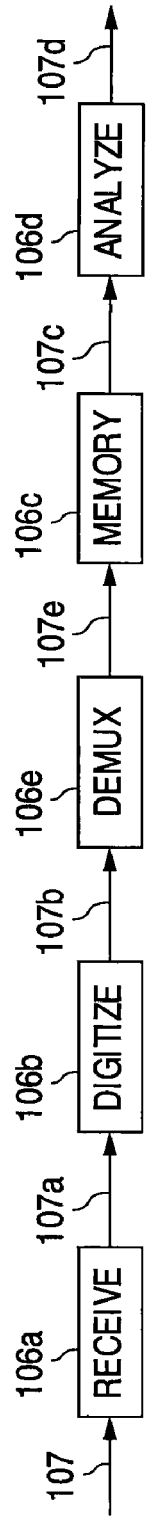
Figure 11B:
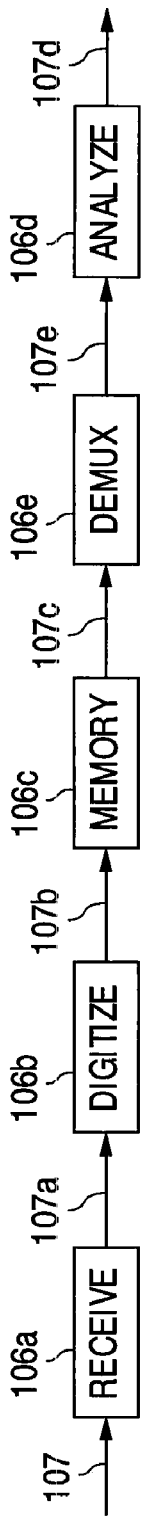

Referring to FIGS. 11A and 11B, in accordance with further embodiments of the presently claimed invention, separation of the incoming signals 11at, 11bt, 11dt is done in the digital domain. Referring to FIG. 11A, such signal separation can be done by demultiplexing the digitized signal 107b prior to storage in the memory 106c. Accordingly, the selected, i.e., demultiplexed, signal 107e is stored in the memory 106c for later retrieval and analysis, as discussed above. Referring to FIG. 11B, such signal separation can be done by demultiplexing the digital data 107c following its retrieval from storage in the memory 106c. Accordingly, the selected data 107e is provided for analysis, as discussed above.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for testing multiple data signal transceivers substantially simultaneously with a common transceiver tester, comprising:
   initiating, with a first portion of a transceiver tester, a plurality of data signal transmissions by a plurality of data signal transceivers;
   capturing, during each one of a first plurality of mutually exclusive time intervals with a second portion of said transceiver tester, a respective portion of said plurality of data signal transmissions from each one of one or more respective ones of said plurality of data signal transceivers to provide one or more corresponding portions of a plurality of captured data, wherein each of said captured portions is less than the entirety of the corresponding data signal transmission; and
   analyzing, during each one of a second plurality of time intervals with said second portion of said transceiver tester, one or more respective portions of said plurality of captured data, wherein each one of said second plurality of time intervals follows a respective one of said first plurality of mutually exclusive time intervals.

2. The method of claim 1, wherein said initiating comprises:
   defining a plurality of sequences of data signal transmissions as said plurality of data signal transmissions; and
   triggering respective ones of said plurality of sequences of data signal transmissions.

3. The method of claim 2, wherein said triggering comprises triggering said respective ones of said plurality of sequences of data signal transmissions by each one of said plurality of data signal transceivers substantially contemporaneously.

4. The method of claim 2, wherein said triggering comprises triggering said respective ones of said plurality of sequences of data signal transmissions by each one of said plurality of data signal transceivers during a respective one of said first plurality of substantially mutually exclusive time intervals.

5. The method of claim 1, wherein:
   said plurality of data signal transmissions comprises a plurality of predetermined sequences of data signal transmissions; and
   said initiating comprises triggering respective ones of said plurality of predetermined sequences of data signal transmissions.

6. The method of claim 5, wherein said triggering comprises triggering said respective ones of said plurality of predetermined sequences of data signal transmissions by each one of said plurality of data signal transceivers substantially contemporaneously.

7. The method of claim 5, wherein said triggering comprises triggering said respective ones of said plurality of predetermined sequences of data signal transmissions by each one of said plurality of data signal transceivers during a respective one of said first plurality of substantially mutually exclusive time intervals.

8. The method of claim 1, wherein said capturing comprises:
   receiving said respective portion of said plurality of data signal transmissions from said each one of one or more respective ones of said plurality of data signal transceivers;
   digitizing each said received respective portion of said plurality of data signal transmissions to provide a plurality of digitized data; and storing said plurality of digitized data to provide said one or more corresponding portions of a plurality of captured data.

9. The method of claim 1, wherein said capturing comprises:
separating said plurality of data signal transmissions to provide a plurality of data signals each of which corresponds to said respective portion of said plurality of data signal transmissions from said each one of one or more respective ones of said plurality of data signal transceivers;
digitizing each one of said plurality of data signals to provide a plurality of digitized data sets; and
storing said plurality of digitized data sets to provide said one or more corresponding portions of a plurality of captured data.

10. The method of claim 1, wherein said capturing comprises:
receiving said respective portion of said plurality of data signal transmissions from said each one of one or more respective ones of said plurality of data signal transceivers;
digitizing each said received respective portion of said plurality of data signal transmissions to provide a plurality of digitized data;
separating said plurality of digitized data to provide a plurality of digitized data sets; and
storing said plurality of digitized data sets to provide said one or more corresponding portions of a plurality of captured data.

11. The method of claim 1, wherein said capturing comprises:
receiving said respective portion of said plurality of data signal transmissions from said each one of one or more respective ones of said plurality of data signal transceivers;
digitizing each said received respective portion of said plurality of data signal transmissions to provide a plurality of digitized data;
storing said plurality of digitized data to provide a stored plurality of digitized data; and
separating said stored plurality of digitized data to provide a plurality of digitized data sets as said one or more corresponding portions of a plurality of captured data.

12. The method of claim 1, wherein said capturing comprises switchably coupling to a respective one of said plurality of data signal transceivers during each one of said first plurality of mutually exclusive time intervals with said second portion of said transceiver tester to receive said respective portion of said plurality of data signal transmissions.

13. The method of claim 1, wherein said analyzing comprises comparing each respective portion of said plurality of captured data to a respective portion of a plurality of predetermined data.

14. An apparatus including a transceiver tester for testing multiple data signal transceivers substantially simultaneously, comprising:
initiating means for initiating a plurality of data signal transmissions by a plurality of data signal transceivers;
capturing means for capturing, during each one of a first plurality of mutually exclusive time intervals with a second portion of said transceiver tester, a respective portion of said plurality of data signal transmissions from each one of one or more respective ones of said plurality of data signal transceivers to provide one or more corresponding portions of a plurality of captured data, wherein each of said captured portions is less than the entirety of the corresponding data signal transmission; and
analyzing means for analyzing, during each one of a second plurality of time intervals with said second portion of said transceiver tester, one or more respective portions of said plurality of captured data, wherein each one of said second plurality of time intervals follows a respective one of said first plurality of mutually exclusive time intervals.

15. The apparatus of claim 14, wherein said initiating means is for:
defining a plurality of sequences of data signal transmissions as said plurality of data signal transmissions; and
triggering respective ones of said plurality of sequences of data signal transmissions.

16. The apparatus of claim 15, wherein said initiating means is for triggering said respective ones of said plurality of sequences of data signal transmissions by each one of said plurality of data signal transceivers substantially contemporaneously.

17. The apparatus of claim 15, wherein said initiating means is for triggering said respective ones of said plurality of sequences of data signal transmissions by each one of said plurality of data signal transceivers during a respective one of said first plurality of substantially mutually exclusive time intervals.

18. The apparatus of claim 14, wherein said plurality of data signal transmissions comprises a plurality of predetermined sequences of data signal transmissions, and said initiating means is for triggering respective ones of said plurality of predetermined sequences of data signal transmissions.

19. The apparatus of claim 18, wherein said initiating means is for triggering said respective ones of said plurality of predetermined sequences of data signal transmissions by each one of said plurality of data signal transceivers substantially contemporaneously.

20. The apparatus of claim 18, wherein said initiating means is for triggering said respective ones of said plurality of predetermined sequences of data signal transmissions by each one of said plurality of data signal transceivers during a respective one of said first plurality of substantially mutually exclusive time intervals.

21. The apparatus of claim 14, wherein said capturing means is for:
receiving said respective portion of said plurality of data signal transmissions from said each one of one or more respective ones of said plurality of data signal transceivers;
digitizing each said received respective portion of said plurality of data signal transmissions to provide a plurality of digitized data; and
storing said plurality of digitized data to provide said one or more corresponding portions of a plurality of captured data.

22. The method of claim 14, wherein said capturing means is for:
separating said plurality of data signal transmissions to provide a plurality of data signals each of which corresponds to said respective portion of said plurality of data signal transmissions from said each one of one or more respective ones of said plurality of data signal transceivers;
digitizing each one of said plurality of data signals to provide a plurality of digitized data sets; and storing said plurality of digitized data sets to provide said one or more corresponding portions of a plurality of captured data.

23. The method of claim 14, wherein said capturing means is for:
- receiving said respective portion of said plurality of data signal transmissions from said each one of one or more respective ones of said plurality of data signal transceivers;
- digitizing each said received respective portion of said plurality of data signal transmissions to provide a plurality of digitized data;
- separating said plurality of digitized data to provide a plurality of digitized data sets; and
- storing said plurality of digitized data sets to provide said one or more corresponding portions of a plurality of captured data.

24. The method of claim 14, wherein said capturing means is for:
- receiving said respective portion of said plurality of data signal transmissions from said each one of one or more respective ones of said plurality of data signal transceivers;
- digitizing each said received respective portion of said plurality of data signal transmissions to provide a plurality of digitized data;
- storing said plurality of digitized data to provide a stored plurality of digitized data; and
- separating said stored plurality of digitized data to provide a plurality of digitized data sets as said one or more corresponding portions of a plurality of captured data.

25. The apparatus of claim 14, wherein said capturing means is for switchably coupling to a respective one of said plurality of data signal transceivers during each one of said first plurality of mutually exclusive time intervals with said second portion of said transceiver tester to receive said respective portion of said plurality of data signal transmissions.

26. The apparatus of claim 14, wherein said analyzing means is for comparing each respective portion of said plurality of captured data to a respective portion of a plurality of predetermined data.

* * * * *

UNITED STATES PATENT AND TRADEMARK OFFICE
CERTIFICATE OF CORRECTION

| | | |
|---|---|---|
| PATENT NO. | : 8,170,490 B2 | Page 1 of 1 |
| APPLICATION NO. | : 12/420294 | |
| DATED | : May 1, 2012 | |
| INVENTOR(S) | : Christian Volf Olgaard | |

It is certified that error appears in the above-identified patent and that said Letters Patent is hereby corrected as shown below:

Column 10, Line 58, Claim 22: Delete the word "method" and replace with the word "apparatus"

Column 11, Line 4, Claim 23: Delete the word "method" and replace with the word "apparatus"

Column 11, Line 17, Claim 24: Delete the word "method" and replace with the word "apparatus"

Signed and Sealed this
Eleventh Day of September, 2012

David J. Kappos
*Director of the United States Patent and Trademark Office*